United States Patent [19]

Silverstein et al.

[11] Patent Number: 5,068,597
[45] Date of Patent: Nov. 26, 1991

[54] SPECTRAL ESTIMATION UTILIZING A MINIMUM FREE ENERGY METHOD WITH RECURSIVE REFLECTION COEFFICIENTS

[75] Inventors: Seth D. Silverstein; Joseph M. Pimbley, both of Schenectady, N.Y.

[73] Assignee: General Electric Company, Schenectady, N.Y.

[21] Appl. No.: 428,809

[22] Filed: Oct. 30, 1989

[51] Int. Cl.$^5$ .............................................. G01R 23/16
[52] U.S. Cl. ............................... 324/77 B; 324/77 D; 364/485; 342/192
[58] Field of Search ................ 364/485; 342/192, 195; 324/77 B, 77 D, 77 R

[56] References Cited

U.S. PATENT DOCUMENTS

| | | | |
|---|---|---|---|
| 3,124,745 | 3/1964 | Schroeder | 364/485 |
| 3,937,899 | 2/1976 | Denenberg | 364/485 |
| 3,983,379 | 9/1976 | Scott | 364/485 |
| 4,782,523 | 11/1988 | Galand | 324/77 B |

Primary Examiner—Kenneth Wieder
Assistant Examiner—Jose M. Solis
Attorney, Agent, or Firm—Marvin Snyder; James C. Davis, Jr.

[57] ABSTRACT

A method for rapidly estimating power spectral density components $\rho(f)$ in the spectrum of an input signal, by first digitizing the input signal over a selected time interval at a selected sample rate; computing an m-th order prediction error energy as an arithmetic mean of forward and backward prediction error energies; and then computing an m-th order prediction error power from a previous reflection coefficient $\Gamma$ computation. A control parameter $\alpha$ is generated; using $\alpha$ and $\Gamma$, an m-th order entropy H and free energy F are then computed, from which is computed m-th order reflection coefficients as extremum of the m-th order Free energy. If the proper extremes are not found, new feedback for the (m+1)-st order solution is generated. If the proper extremes are found, the spectral components are computed and recorded.

1 Claim, 12 Drawing Sheets

SPECTRAL ESTIMATION UTILIZING A MINIMUM FREE ENERGY METHOD WITH RECURSIVE REFLECTION COEFFICIENTS

BACKGROUND OF THE INVENTION

The present invention relates to spectral estimation of non-deterministic signals and, more particularly, to a more robust method for estimating spectral components of incomplete and/or noisy input signal records.

It is known to utilize a maximum entropy method for estimation of spectral components of a signal, as originally discussed by J. P. Burg in "Maximum Entropy Spectral Analysis", *Proc. 37th Meeting Society Exploration Geophysicist* (1967), but such spectral estimators exhibit severe degradation from either noisy or short input data records if autoregressive (AR) or autoregressive-moving-average (ARMA) estimation models are utilized. Because spectral estimation methods are useful in a variety of technical applications, including voice recognition, voice and image compression Doppler velocimetry, moving target indication and/or target-bearing estimation (in radar and sonar systems) high resolution spectroscopy for qualitative and quantitative chemical analysis, and the like, it is highly desirable to have a robust spectrum estimation method which can operate even when the incoming sample signaled data records fluctuate due to incompleteness and/or noise. The use of a constrained maximum entropy approach, where a Lagrange multiplier in the constrained extremal value problem can be interpreted as an effective temperature parameter, is known from the work of S. J. Wernecke and L. R. D'Addario, "Maximum Entropy Image Reconstruction", *IEEE Trans. Comput.*, vol C-26, pp 351-364 (1977); S. F. Gull and G. J. Daniell, "Image Reconstruction From Incomplete and Noisy Data," *Nature* vol. 272, pp. 686- 690 (1978); and T. J. Cornwell, "A Method of Stabilizing The CLEAN Algorithm, " *Astron. Astrophys.*, vol. 121, pp. 281-285, (1983) wherein two-dimensional spatial-spectral super-resolution radio-astronomy imagery was considered using data generated from large aperture synthesis techniques. In these works, the solution to the state variables were generated either by Newton-Raphson iterative solutions, or by the deployment of a non-linear deconvolution algorithm (with the acronym "CLEAN" as originally introduced by J. Högbom, in "Aperture Synthesis With a Non-Regular Distribution of Interferometer Baselines," *Astrophys. J. Suppl.*, vol. 15, pp. 417-426, 1974. However, it is desirable to provide a method having not only greater accuracy, but shorter implementation time than either the Newton-Raphson or CLEAN algorithmic solution methods utilized in this prior art.

BRIEF SUMMARY OF THE INVENTION

In accordance with the invention, a method for rapidly estimating power spectral density components $\rho(f)$ in the spectrum of an input signal, includes the steps of: digitizing the input signal over a selected time interval at a selected sample rate; computing an m-th order prediction error energy as an arithmetic mean of forward and backward prediction error energies; then computing an m-th order prediction error power from a previous reflection coefficient $\rho$ computation; generating a control parameter $\alpha$; then computing, using $\alpha$ and $\rho$, an m-th order entropy H and free energy F, from which is order reflection the m-th order reflection coefficients as an extremum of the m-th order free energy. If the proper extremes are not found, new feedback for the (m+1)-st order solution is generated. If the proper extreme is found, the spectral components are computed and recorded, for further use as required.

In one presently preferred embodiment, the input signal is the processed received return signal in an ISAR radar unit, and the estimated spectral components are compared with known signatures to determine what form of target is returning the echos.

Accordingly, it is an object of the present invention to provide a method for rapidly estimating the spectral components of a signal.

This and other objects of the present invention will be understood by those skilled in this art, upon reading of the following detailed description, when considered in conjunction with the drawings.

DETAILED DESCRIPTION OF THE INVENTION

Figure 1A:
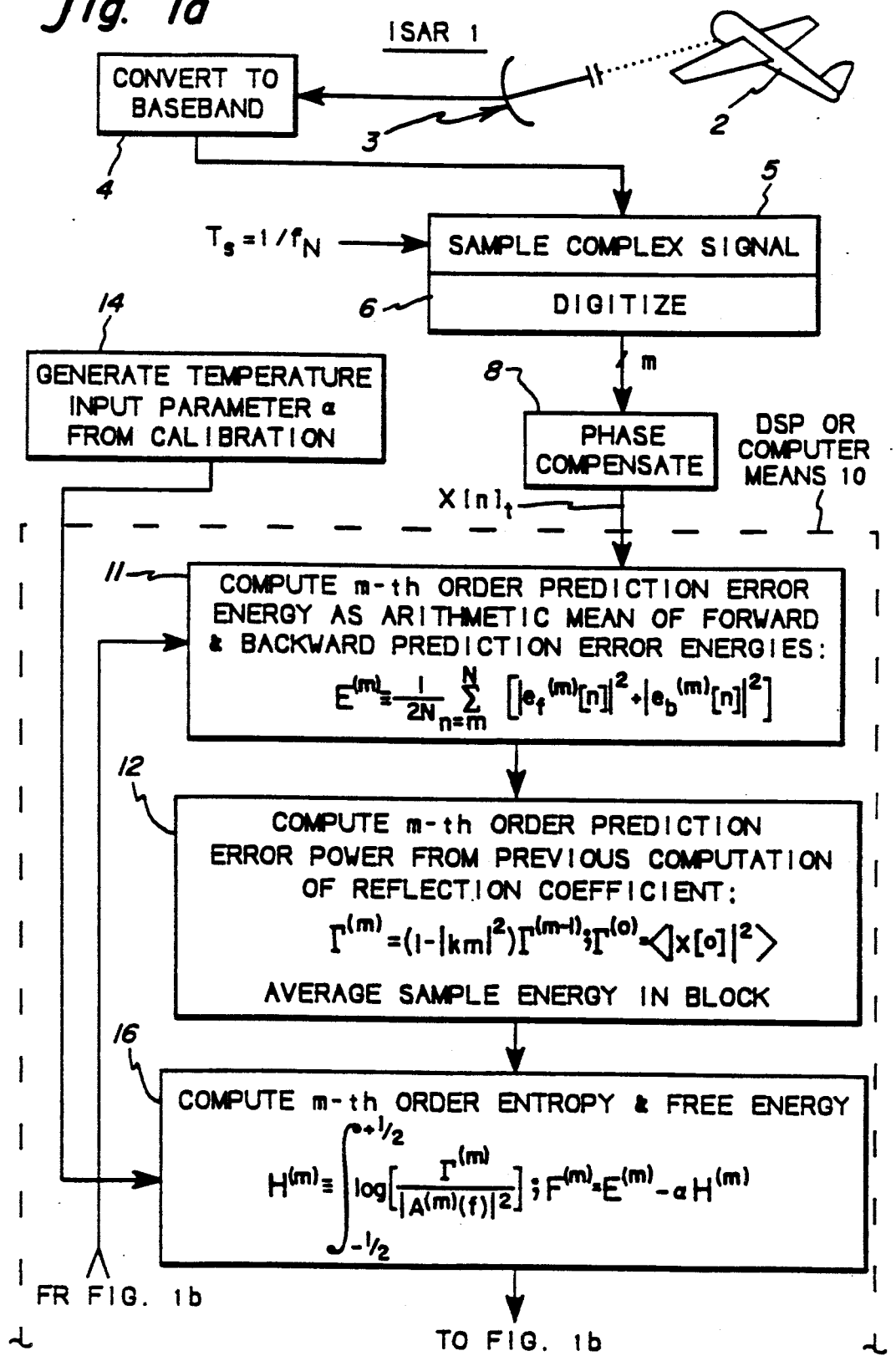
FIG. 1 is a flow diagram of the method of the present invention, as applied in a radar system.
Figure 1B:
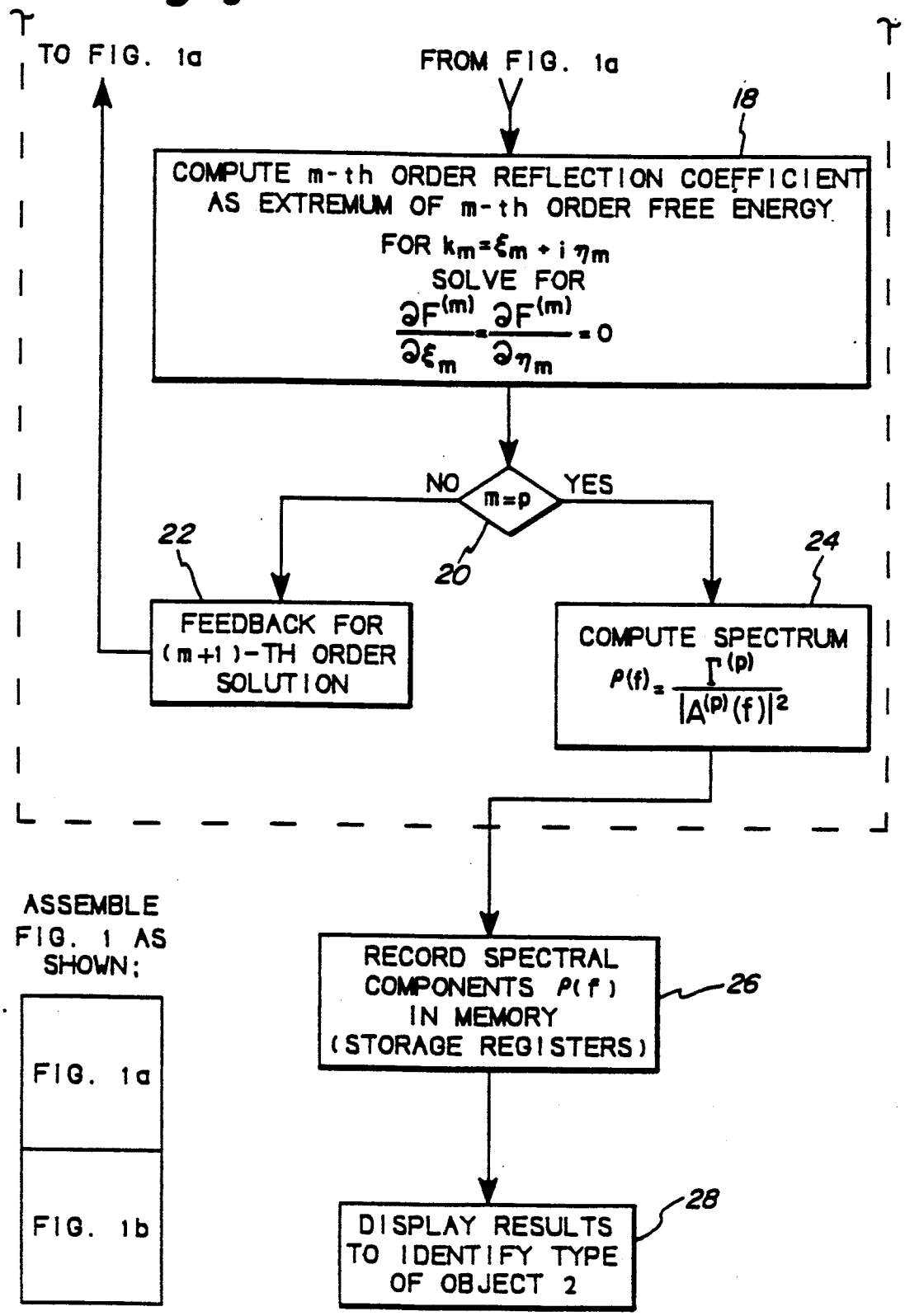

Our minimum-free-energy (MFE) parametric estimation method is based upon the obtaining of a global minimum of an appropriately-defined free energy function (FEF). A direct analogy can be made here with thermodynamic science and the MFE free energy objective function can be taken as a linear combination of error energy and the signal entropy in the system. The negative coefficient of the entropy term in the free energy expression is established by us as an effective signal processing temperature, $\alpha$. If viewed from a cost function perspective, the addition of a negative measure of entropy, with a strength controlled by a control parameter $\alpha$ (which we will interpret as an effective signal processing temperature in analogy with thermodynamics) serves to reduce the net cost for solutions which have greater a priori probability of existence as measured by their smoothness. Thus, MFE is a generic method which can be formulated in many different ways, i.e. a different formulation can be provided for each different one of a variety of estimation applications. It will be seen that in the limit of low contamination (that is, with a correspondence to a limit of zero effective temperature) our minimum free energy method provides answers which reduce identically to the minimum mean squared error counterpart.

It is important to understand that optimal values of the temperature control parameter $\alpha$ are tied both to the contamination level of the input data (its signal-to-noise ratio) and to the order of the parametric model used. We have found, and our simulations indicate, that precise values of the control parameter $\alpha$ are not at all critical. Instead, it appears that our MFE method operates well within relatively broad tolerance ranges to extract the signal spectra represented in a stream of sampled data obtained from a complex input signal. Thus, in analysis of real systems, the range of the temperature, or control, parameter $\alpha$ can be calibrated with a known source.

The MFE algorithmic process described herein is an adaptation of Burg's algorithm for recursively solving the linear prediction problem. This algorithm works directly with the block data record and therefore avoids the potential problems which can occur in the algorithms requiring an initial approximation for the autocorrelation matrix. In this algorithm, the reflection coefficients at each stage in the Levinson recursion are determined from the extremal conditions on the sum of the forward and backward prediction error powers. In the MFE version of this algorithm, which is called MFE-RRC with the RRC standing for recursive reflection coefficients, the reflection coefficients are calculated form the extremal conditions of a free energy function at each stage in the recursion.

THE MATHEMATICAL VIEW OF THE MFE-ACS METHOD

In our MFE-RRC method, we define an error energy U which, at the m-th order in the Levinson recursion, is a linear combination of the forward and backward linear prediction error powers, $$U^{(m)} = \frac{1}{2(N-m)} \sum_{n=m}^{N-1} [|e_f^{(m)}[n]|^2 + |e_b^{(m)}[n]|^2] \quad (1)$$

In the original Burg algorithm, the function $U^{(m)}$ by itself is minimized at each stage in the recursion. We now introduce the entropy $H^{(m)}$ associated with the m-th recursive stage, $$H^{(m)} = \int_{-\frac{1}{2}}^{+\frac{1}{2}} \log[P_c^{(m)}(f)] df = \int_{-\frac{1}{2}}^{+\frac{1}{2}} \log\left[\frac{\beta^{(m)}}{|A^{(m)}(f)|^2}\right] df \quad (2)$$

Here $P^{(m)}(f)$ is the m-th order model power spectral density, $\beta^{(m)}$ represents the error power at each stage commensurate with a minimum of the m-th stage free energy function, $F^{(m)} = U^{(m)} - \alpha H^{(m)}$. Here the $\beta^{(m)}$'s satisfy the recursion relation, $$\beta^{(m)} = (1 - |k^{(m)}|^2)\beta^{(m-1)} \quad (3)$$

where $k^{(m)}$ corresponds to the m-th reflection coefficient. The first term, $\beta^{(0)}$, is equal to the energy of the block of sampled complex signal, $$\beta^{(0)} = R_d[0] = \frac{1}{N} \sum_{n=0}^{N-1} |x[n]|^2 \quad (4)$$

$F^{(m)}$ is minimized by differentiating with respect to the real and imaginary parts of the complex reflection coefficients and equating the results to zero. In each order, the solutions are obtained from the roots of a relatively simple cubic equation. The computational complexity of the MFE version of the Burg recursive algorithm is quite comparable to that of the original Burg algorithm.

EXAMPLES

For example, images can be generated utilizing a MFE spectral processor as a high-performance subsystem in an inverse synthetic aperture radar (ISAR) imaging system 1. In this case, a radar image can be generated under conditions which do not allow a standard optical or visual image to be obtained. Thus, images can be obtained at night time, in all weather even though normally precluded by cloud cover and at ranges extended beyond the normal optical range. Since radar aircraft images are an important means of aircraft identification, whether used for civil or military recognizance, such radar signals, at extended ranges are highly desirable. Thus, an aircraft 2 provides an echo to a radio-frequency processing chain 3, which RF echo is then demodulated down to baseband by a converter 4. The baseband signal is sampled in unit 5 and digitized in unit 6, before being phase compensated in unit 8 and provided as the sampled complex signal $X[n]_t$ to the MFE spatial spectrum estimator 10, which can use an appropriately programmed general digital computer or digital signal processor (DSP) means. The MFE process is particularly suited to this application because the radar echo signals are modeled well as a series of point sources which arise from specific glint scatterers on the aircraft surface. In ISAR the motion of the object to be imaged is used synthetically to generate the radar aperture, while the transmitter-receiver system is usually kept fixed. Thus, one can gain physical insight into the ISAR process by viewing the system through the eyes of an observer sitting on the target to be imaged. To this observer, the transmitter/receiver system appears to be moving at the velocity $-V_t$ while emitting a series of N coherent pulses at a uniform pulse repetition rate $1/T_p$. To the observer, the ISAR signals are indistinguishable from similar signals which would be generated from a fixed linear-phased array. The fixed array, in such an example, would have to be oriented in the direction of the relative philosophy, have a length $Nv_tT_p$, with element spacing $v_tT_p$, and be operated in a sequential firing mode.

Such a system suffers from image aberration problems arising from sampled aperture systems when the object is not in the far field of the aperture. This is analogous to the experience almost everyone has had with photographs, where the images are distorted because of improper focussing. Out-of-focus blurring effects occur when the optical system transfer function does not properly compensate for the near-field terms in the phase of the scattered signal. The phase compensation necessary for focussing can usually be achieved by adjusting the lens position relative to the focal plane, along the optical axis. For relatively narrow band (temporal frequency) sources, the mathematical structure for image generation in the far-field of a uniformly sampled coherent aperture is identical to the mathematics of estimating the frequency spectrum of a uniformly-sampled coherent time series. A phase compensated near-field spatial imaging problem will therefore be reduced to the canonical structural form of a uniformly-sampled time-series. Therefore, images can be generated using either Fourier-based spectral estimation algorithms, such as the periodogram and the like, or by alternatively using one of the super-resolution matrix-based algorithms. The MFE method is particularly suited to this task, as it performs well for a source model of the type characterized by the radar echoes. Therefore, the resulting image will have finer resolution, at a lower signal-to-noise ratio, then would be otherwise usable or obtainable with hitherto, known methods.

In a first simulation study, a relatively simple simulation event was utilized with very high signal-to-noise ratios, in order to isolate incomplete/short data record effects. The complex input signal $X[n]_t$ consists of four complex sinusoids, with frequencies, given in terms of the Nyquist frequency $f_N$, as $f_1 = -0.30 f_N$, $f_2 = -0.10 f_N$, $f_3 = +0.30 f_N$ and $f_4 = +0.32 f_N$. Utilizing a sampled aperture consisting of 32 samples, which corresponds to a Rayleigh resolution (in Nyquist frequency units) of $1/32 = 0.031$, we will recover the four spectral components, including the two positive frequency components which have a spectral separation of only about 0.62 of the Rayleigh resolution. Initially, the total signal is taken as a combination of the source signal plus additional random noise (which we model as complex Gaussian white noise) and, in the example illustrated, provide all four signal components with the same complex amplitude, is the worst case for interference effects between adjacent signals. The results presented correspond to a $p=30$th order predictive model. The MFE method is also effective for lower order models. At each stage in the recursion, the reflection coefficient is estimated on the basis of an MFE estimate rather than the conventional LMS estimate. It is important to note that the simulation results correspond to a single snapshot only; incoherent averaging has not been performed over multiple looks.

The processor means first performs step 11, wherein the m-th order prediction error energy $E^{(m)}$ is computed as the arithmetic mean of a forward prediction error energy $e_f^{(m)}$ and a backward prediction error energy $e_b^{(m)}$. The m-th order prediction error power is then computed, using reflection coefficient $\Gamma^{(m)}$ found for that order (m), in step 12. In step 14, the control, or temperature, $\alpha$ parameter is generated, as by independent measurement with a known source, and the result fed, along with the solution of step 12, into step 16. There, the m-th order entropy $H^{(m)}$ and m-th order free energy $F^{(m)}$ of the system are computed, and the results passed to step 18, where the extremum of the m-th order free energy is found. If the minima are not found, as determined in step 20, a new $(m+1)$-st error energy prediction is found, in step 22, and fed back to step 11, for a new computation. If the proper order is obtained in step 20, step 24 is entered. Having obtained a solution, the power spectral density $\rho(f)$ of the various spatial frequencies is generated in step 24, and then, in step 26, the estimated spectral component results are recorded, by storage of each component in an assigned data register. The stored spectral component estimates can now be utilized, as by display in step 28 on a CRT and the like, or by utilization within the system (e.g to recognize the aircraft type, by comparison of spectral components to a known spectral library) and the like other known uses of recovered echo data.

Figure 2A:
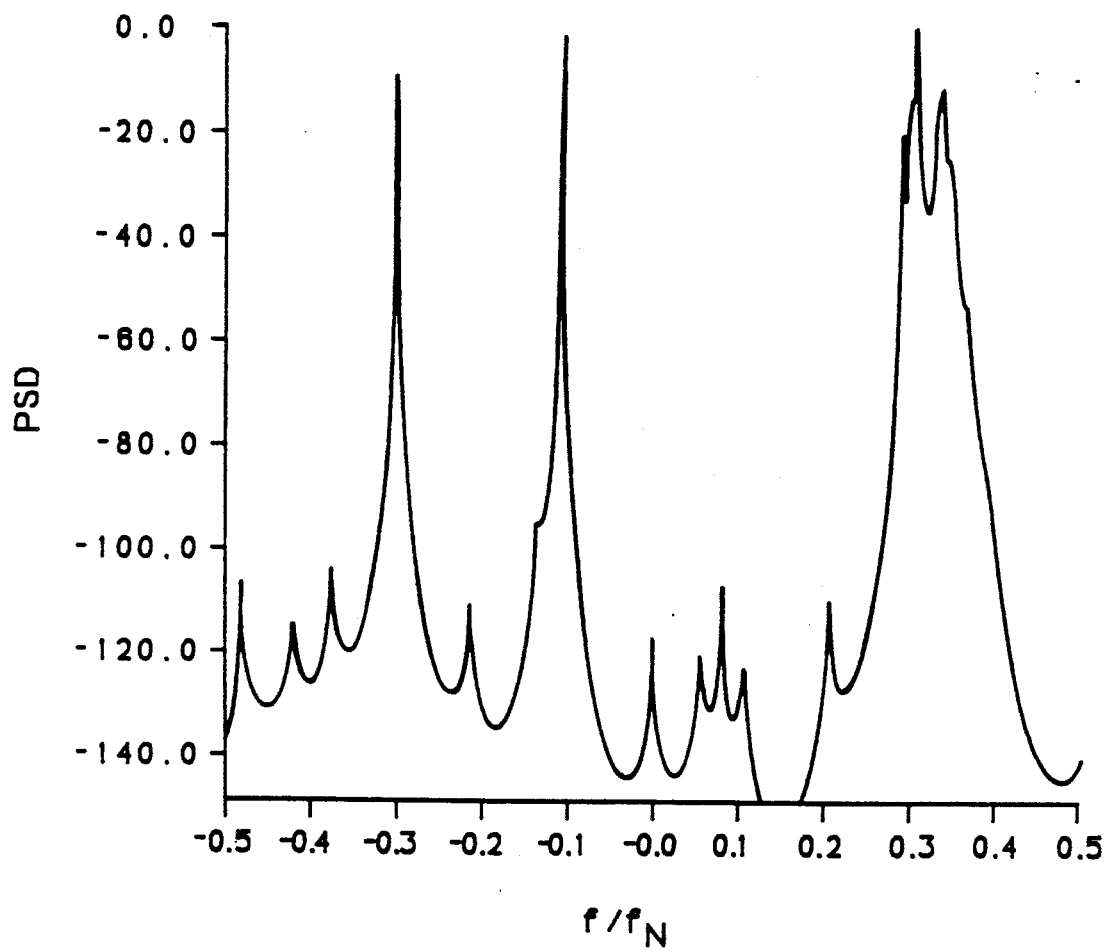
FIG. 2a-2b are graphs illustrating simulation results of a first input with several different temperature $\alpha$ choices, using the method of the present invention.
Figure 2B:
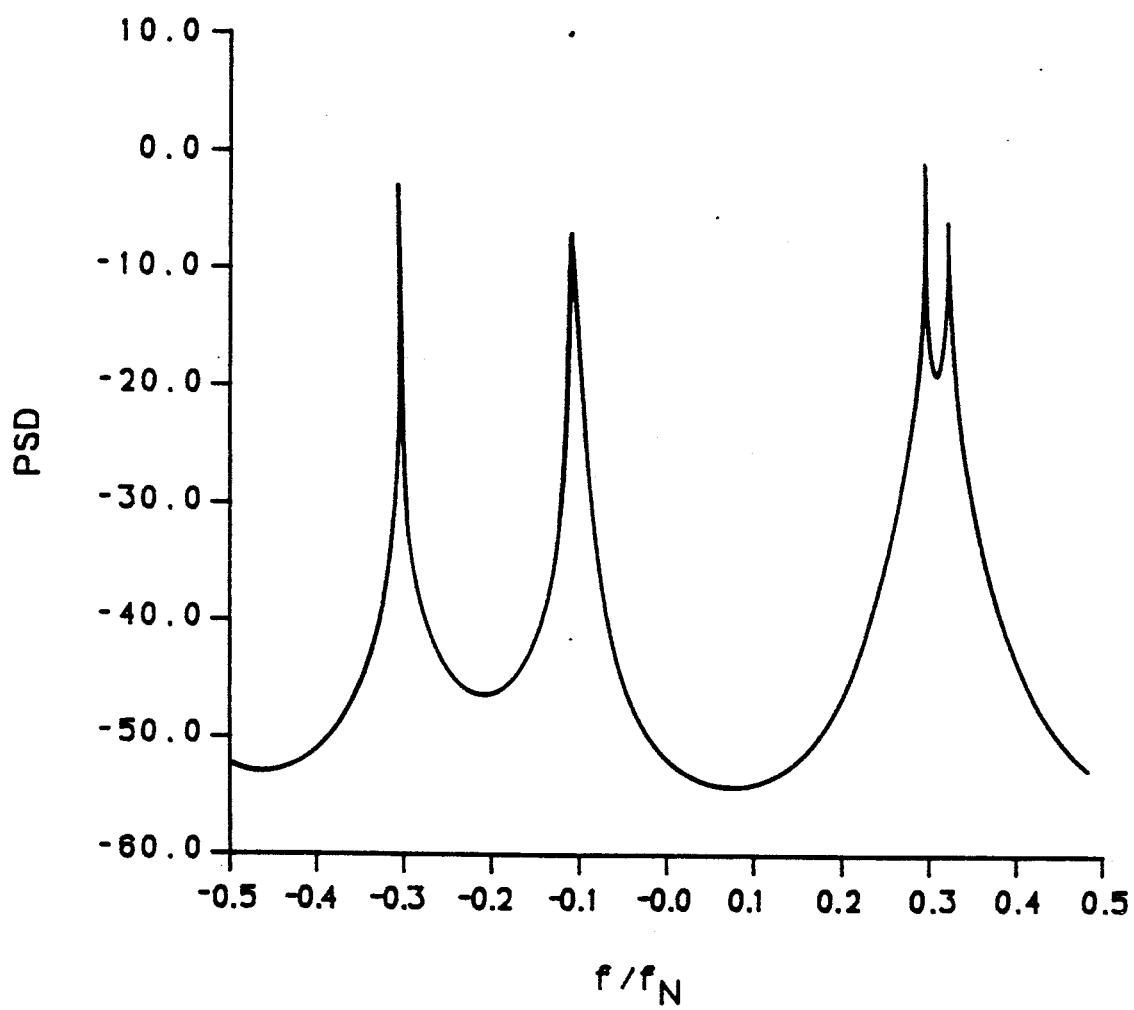
Figure 3A:
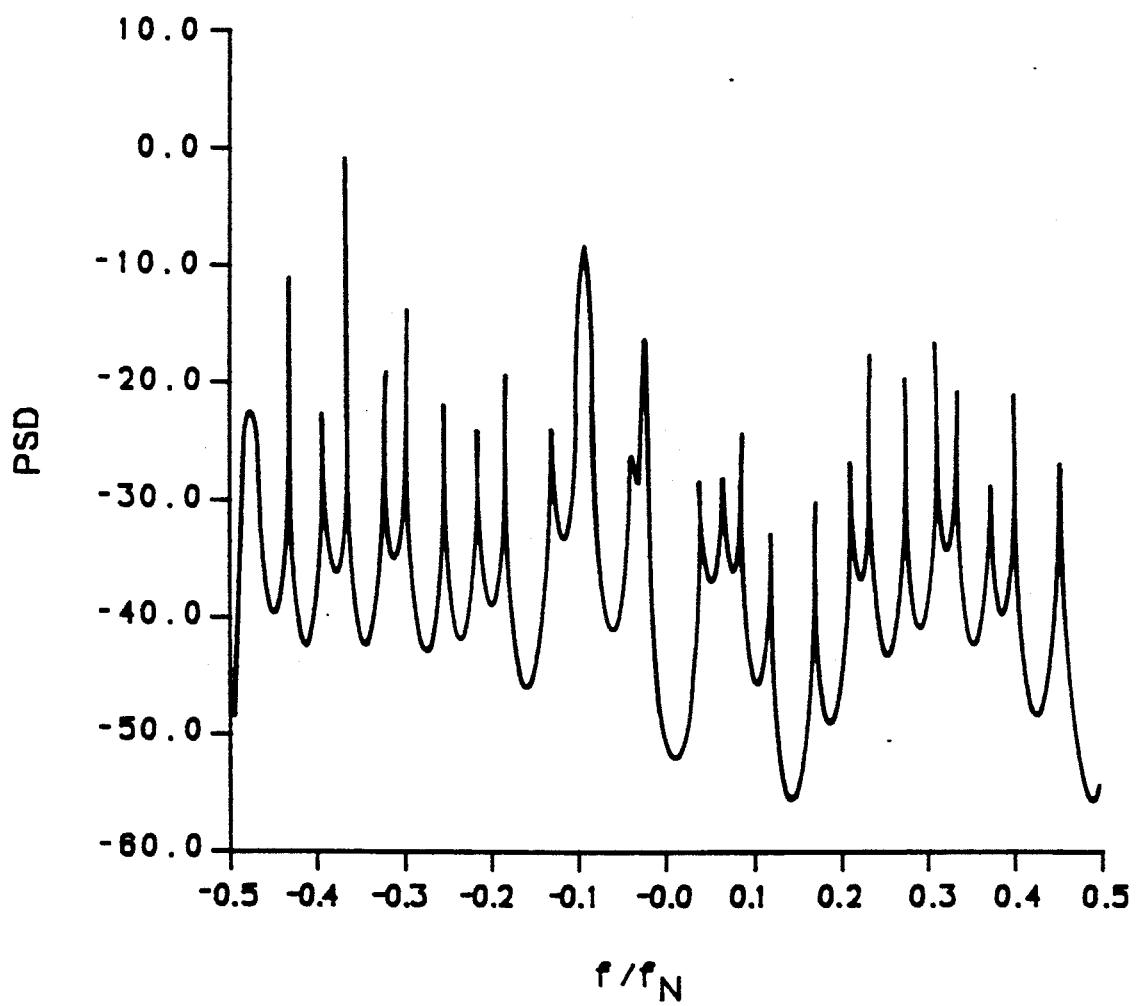
FIGS. 3a-3c and 4a-4c graphs illustrating the simulation results of the method of the present invention operating upon another input signal.
Figure 3B:
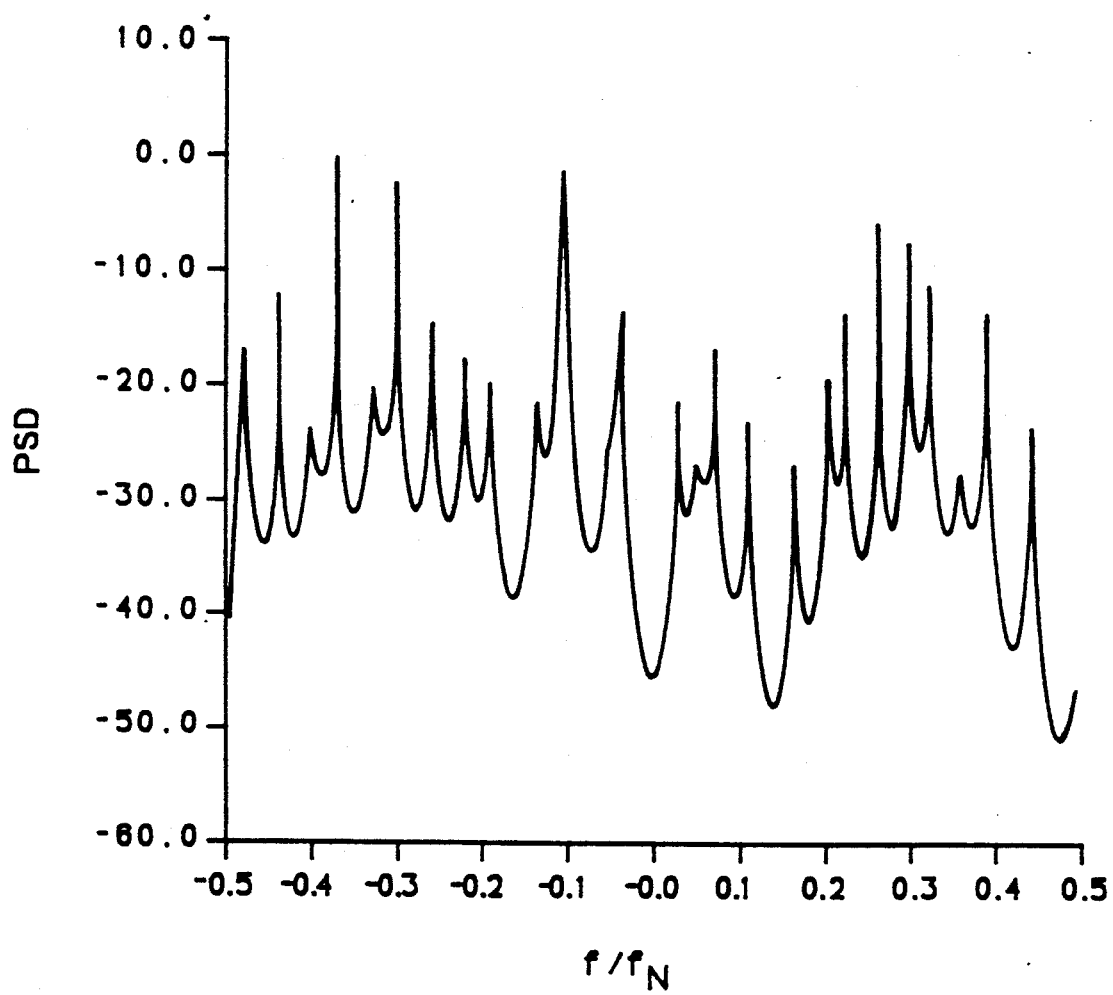
Figure 3C:
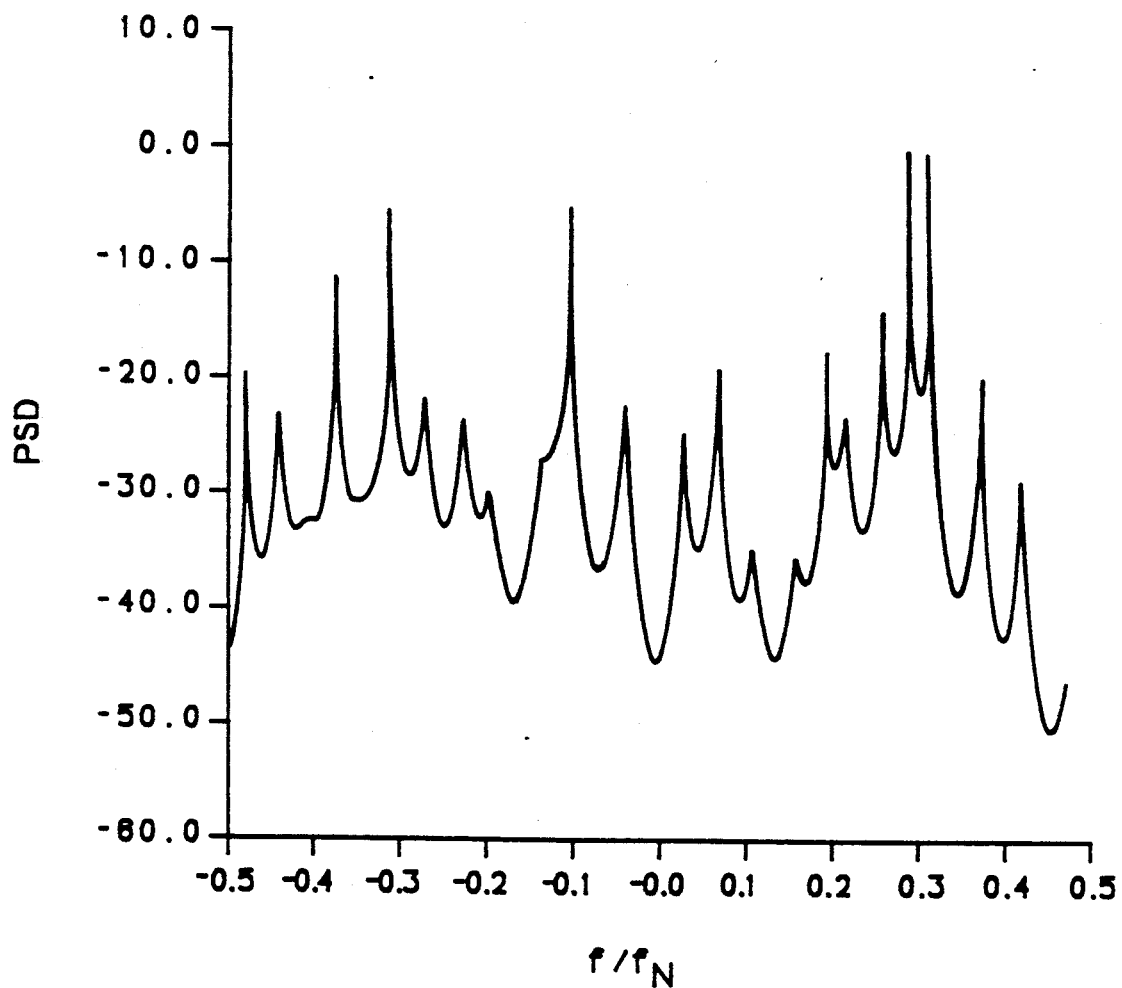
Figure 3D:
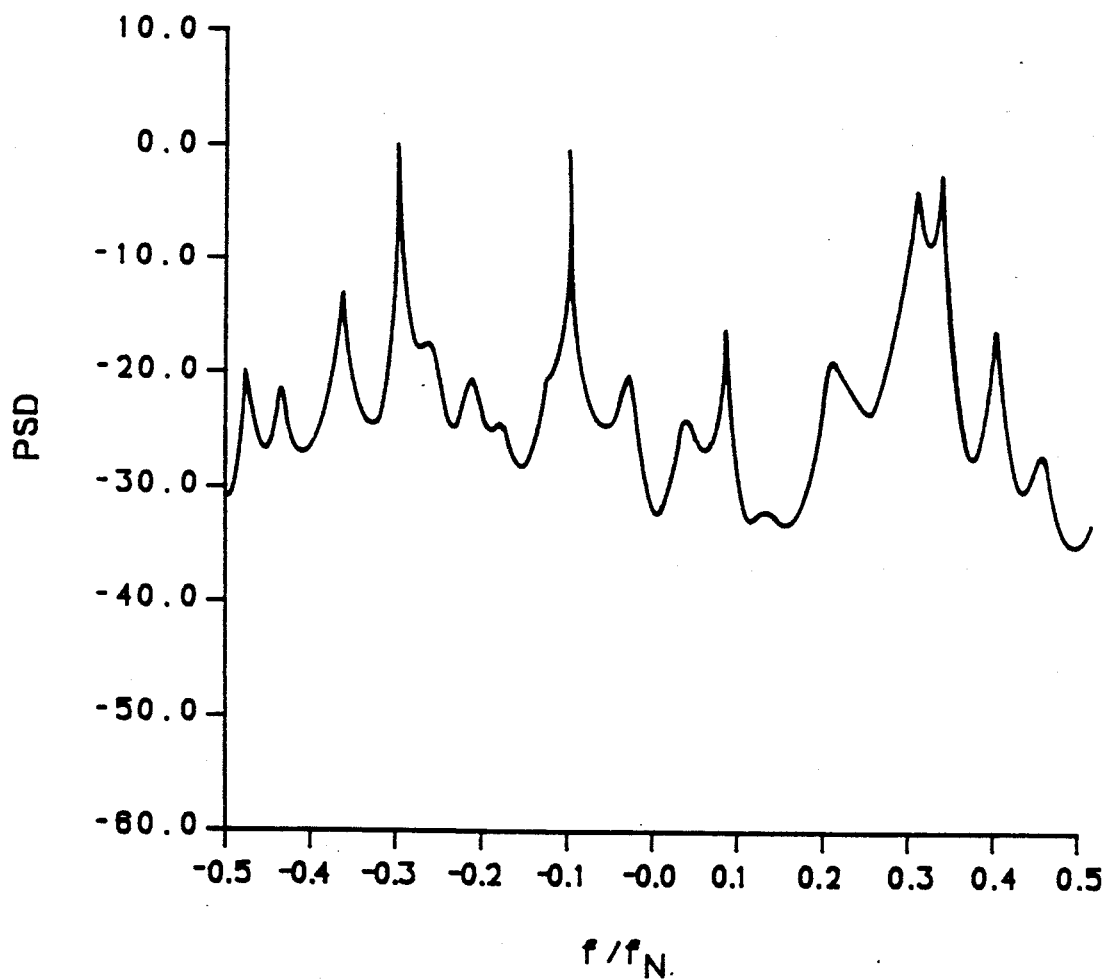
Figure 3E:
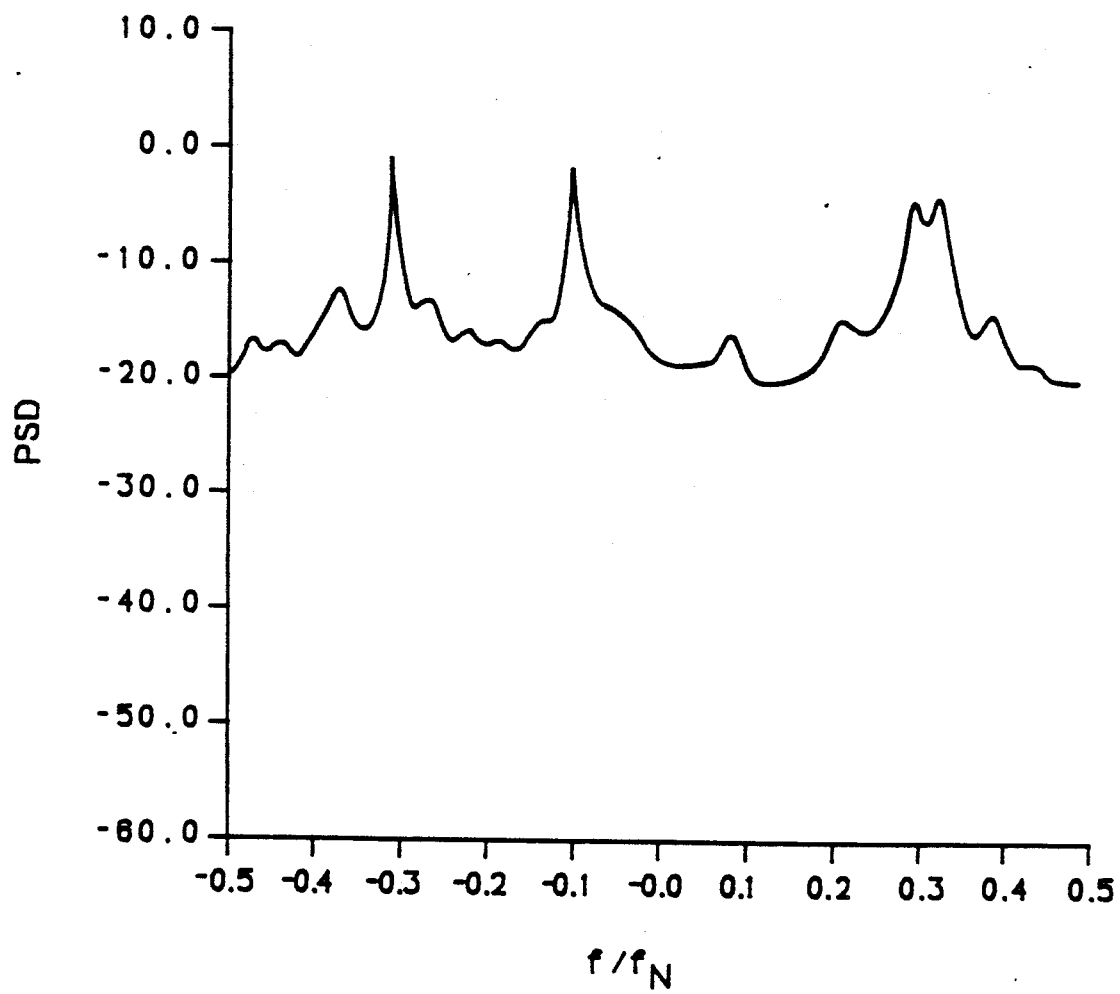

Referring to FIG. 2a, high SNR results are shown for the spectral estimation at zero temperature which corresponds exactly to the LMS estimation used in the prior art. In FIG. 2b, the improved spectrum obtained in the MFE analysis is shown, for $\alpha = 1 \times 10^{-4}$. Two effects are of particular importance. First, the signal bias is significantly reduced; second, the line splitting of the spectral peaks is eliminated. In FIG. 3 we show the results obtained as a function of increasing temperature $\alpha$, at an SNR of 10 dB. The zero temperature, $\alpha = 0$, result illustrated in FIG. 3a corresponds exactly to the LMS result. The improvements made by introducing MFE and increasing temperature $\alpha$ of $10^{-3}$, $10^{-2}$, $10^{-1}$ and $10^{-0}$ are shown in respective FIGS. 3b-3e. Note that these results are not rapidly varying functions of the temperature parameter $\alpha$, which is important to a real system, so that near-optimal signal processing tem-perature calibration adjustments need only be made on a periodic basis.

In another simulation, a time signal phantom was provided with two complex sinusoids at frequency $f_1 = +0.10 f_N$ and $f_2 = +0.12 f_N$, in terms of the Nyquist $f_N$. Similar complex amplitudes were set for both sinusoids, to imply that the two emitters always have the same relative phase at time $t=0$. In order to evaluate the effects of additive random noise, complex Gaussian white noise was added in control amounts to the phantom source signals. The data records $X[n]_t$ for these simulations consist of single snapshots of 25 uniformly-spaced time samples, as would correspond to a Rayleigh frequency resolution, in Nyquist units, of 1/25. Spectral separation of the two closely-spaced positive frequencies $f_1$ and $f_2$ is $\frac{1}{2}$ of the Raleigh resolution, in the phantom test signal. The signal-to-noise ratio of the total signal is defined in terms of the ratio of the total energy in the signal and noise bands; at low signal-to-noise ratios, performance is best judged by repetitive Monte-Carlo simulations, where statistical properties of the spectral output of the method of study. We investigated the behavior of a series of independent snapshot/trials, where the additive noise is uncorrelated for the different trials. If the statistics do not appreciably vary from small to a large number of trials, then one can safely conclude that low trial number results should prove reliable in analyzing contaminated spectra.

Figure 4A:
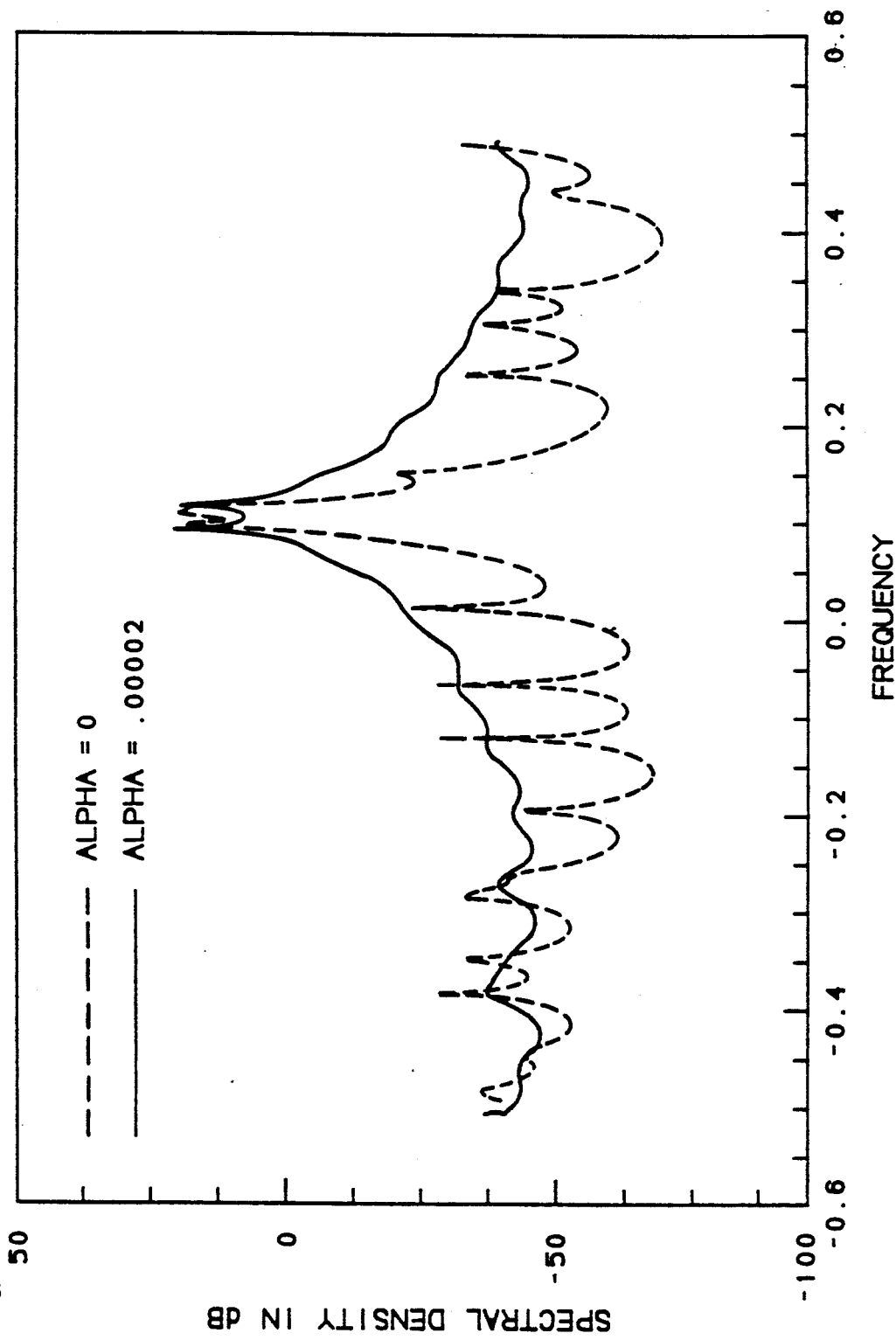
Figure 4B:
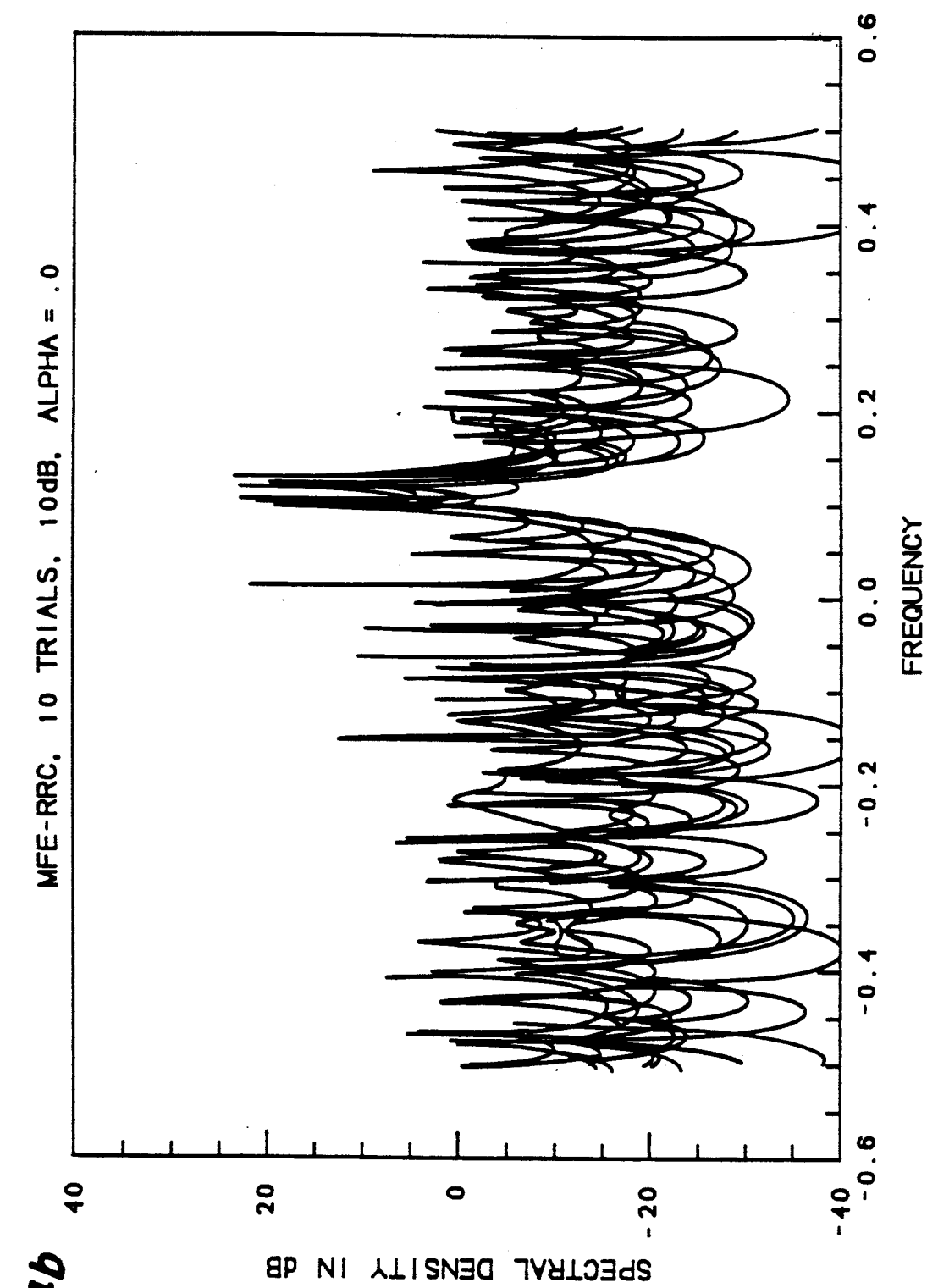
Figure 4C:
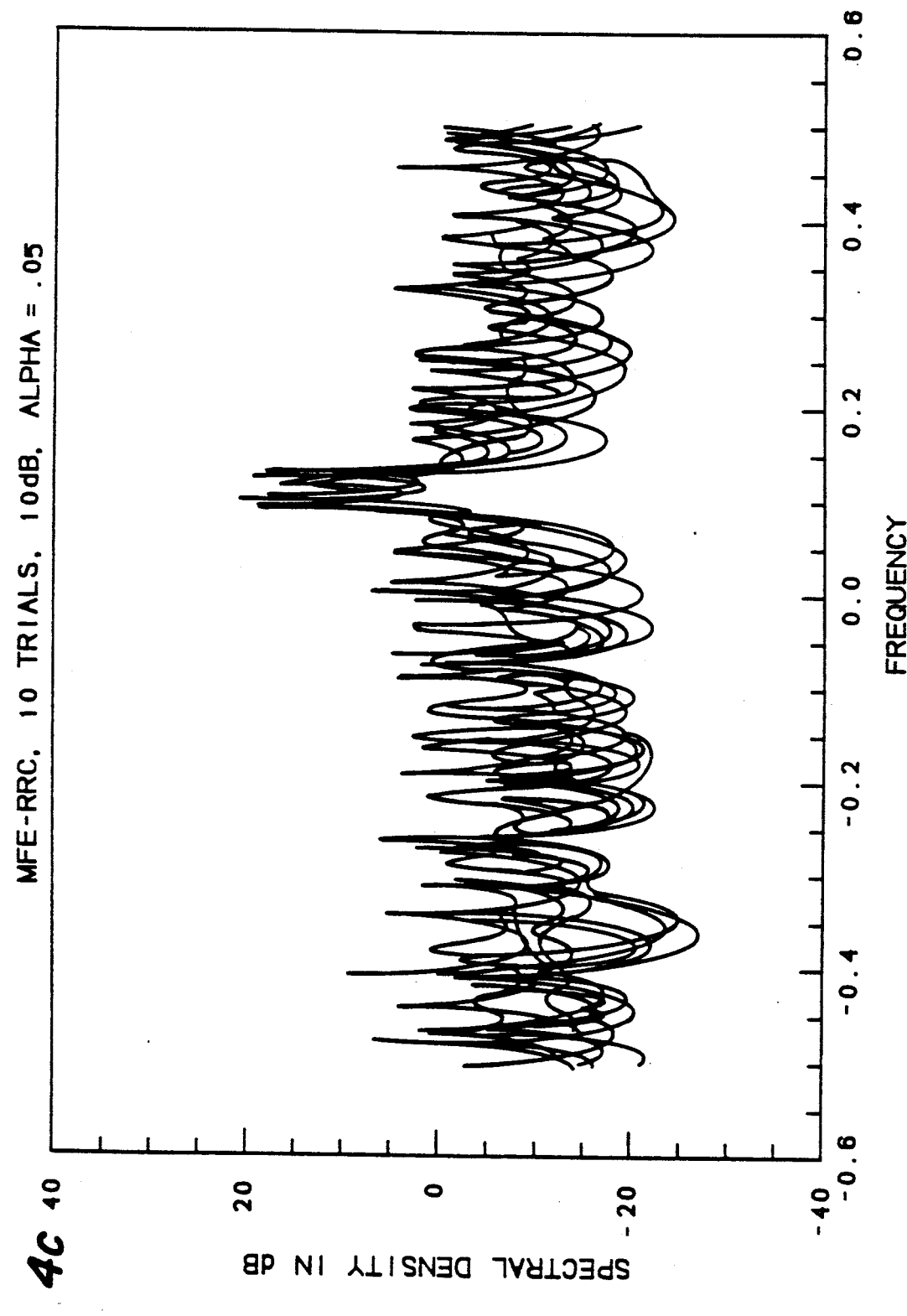

The test spectrum consists of two closely spaced line spectra with the spacing corresponding to $\frac{1}{2}$ of the Rayleigh resolution. We note that at a zero value of the control parameter $\alpha$ the MFE-RRC result corresponds exactly to the original Burg recursive algorithm. FIG. 4a illustrates the results at 60 dB SNR for a 20th-order model. The zero temperature Burg results exhibits distortion in the region of the twin peaks. This distortion is stabilized by adding a small amount of temperature in the MFE-RRC analysis. In FIGS. 4b and 4c, we illustrate overlay plots of 10 different trials at a SNR of 10 dB. The same sequence of random noise spectra were used in both series of trials. At zero temperature, the twin peak structure is often comparable to or even at a lower level than some of the noise peaks. At a temperature $\alpha = 0.05$ we find that the noise levels are suppressed relative to the signal peaks, so that the twin peaks now are typically $\sim 15$ dB above the noise peaks.

While several presently preferred embodiments of our novel invention have been described in detail herein, many modifications and variations will now become apparent to those skilled in the art. It is our intent, therefore, to be limited only by the scope of the appending claims and not by the specific details and instrumentalities presented by way of explanation herein.

What we claim is:

1. A method for rapidly estimating power spectral density components $\rho(f)$ in the spectrum of an input signal $x(t)$, where said spectral components identify an object comprising the steps of:
   (a) digitizing the input signal, with a selected sample rate, to provide a sampled input signal $X[n]_t$;
   (b) computing an m-th order prediction error power as an arithmetic mean of forward and backward prediction error powers of the sampled input signal;
   (c) computing a reflection coefficient $\Gamma^{(m)}$;
   (d) computing, using $\Gamma^{(m)}$, an m-th order pediction error power;

(e) generating a control parameter $\alpha$;
(f) using the parameters $\alpha$ and $\Gamma$, computing an m-th order entropy H and free power F of the sampled input signal;
(g) computing m-th order reflection coefficients as extremum of the m-th order free power.
(h) testing the computed extremum for proper order;
(i) if proper order is not found, generating a new (m+1)-st order solution for feedback to step (b);
(j) if proper order is found, generating power spectral density components $\rho(f)$; and
(k) recording the spectral components $\rho(f)$ thus generated as estimates of the input signal, where said object is identified by said spectral components.

* * * * *